United States Patent [19]
Wu

[11] Patent Number: 5,895,244
[45] Date of Patent: Apr. 20, 1999

[54] PROCESS TO FABRICATE ULTRA-SHORT CHANNEL NMOSFETS WITH SELF-ALIGNED SILICIDE CONTACT

[75] Inventor: Shye-Lin Wu, Hsinchu, Taiwan

[73] Assignee: Texas Instruments - Acer Incorporated, Hsinchu, Taiwan

[21] Appl. No.: 09/004,449

[22] Filed: Jan. 8, 1998

[51] Int. Cl.[6] .................................. H01L 21/336
[52] U.S. Cl. .................... 438/303; 438/655; 438/664; 438/669
[58] Field of Search .................... 438/299, 301, 438/303, 655, 664, 669, 911, 947, 586, 592; 257/383

[56] References Cited

U.S. PATENT DOCUMENTS

| | | | |
|---|---|---|---|
| 4,818,715 | 4/1989 | Chao | 438/303 |
| 4,885,259 | 12/1989 | Osinski et al. | 438/303 |
| 5,753,557 | 5/1998 | Tseng | 438/303 |
| 5,770,507 | 6/1998 | Chen et al. | 438/305 |

OTHER PUBLICATIONS

Takagi, M.T., et al., "A Novel 0.15 μm CMOS Technology . . . ", IEDM Tech. Digest, 1996, pp. 455–458, Dec. 1996.
Ono, M., et al., "Sub–50 nm gate length n–MOSFETs . . . ", IEDM Tech. Digest, 1993, pp. 119–121, Dec. 1993.

Primary Examiner—T. N. Quach
Attorney, Agent, or Firm—Harness, Dickey & Pierce, P.L.C.

[57] ABSTRACT

The method of the present invention is a method of forming a gate oxide layer on the substrate. An undoped polysilicon layer is formed over the gate oxide layer. Then, a silicon nitride layer is formed over the undoped polysilicon layer. A doped polysilicon layer is formed over the silicon nitride layer. Next, the doped polysilicon layer is patterned to define a gate region. A thermal oxidation is performed on the patterned doped polysilicon gate region to oxidize a portion of the patterned doped polysilicon layer into a thermal oxide film. The thermal oxide film is removed by an etching process. A portion of the first dielectric layer is etched by using the residual doped polysilicon layer as a mask. The undoped polysilicon layer is etched by using the residual doped polysilicon layer and the residual first dielectric layer as a mask. Then, a PSG layer is deposited over the residual nitride layer and the substrate to serve as an ion diffusion source. Subsequently, the PSG layer is etched back to form side-wall spacers. A noble or refractory metal layer is deposited on all areas. Next, a high dose arsenic or phosphorus ion is implanted through the substrate to form first doped regions to serve as source and drain regions of the transistor. Finally, the two-step RTP annealing process is used to form a self-aligned silicided contact nMOSFET.

26 Claims, 4 Drawing Sheets

5,895,244

PROCESS TO FABRICATE ULTRA-SHORT CHANNEL NMOSFETS WITH SELF-ALIGNED SILICIDE CONTACT

FIELD OF THE INVENTION

The present invention relates to a semiconductor device, and more specifically to a method of fabricating a metal oxide semiconductor field effect transistor (MOSFET).

BACKGROUND OF THE INVENTION

Metal oxide semiconductor field effect transistors (MOSFETs) have been traditionally used and widely applied in the semiconductor technologies. Device dimensions are continuously scaled down to achieve high-performance CMOS ULSIs (Ultra-Large Scale Integrations). For such scaled devices, however, parasitics such as RC delay and source/drain series resistance easily degrade the circuit performance. As suggested in the reference M. T. Takagi, et al., in IEDM Tech. Dig. p.455, 1996, the degradion factor of propagation delay on a gate electrode is a strong function of both channel width and gate electrode sheet resistance. Thus, the finite value of gate electrode sheet resistance limits the maximum channel width which can be used in ULSIs.

Self-Aligned Ti Silicide contact source/drain and gate (Ti salicide) process is one of the candidates for low gate electrode sheet resistance and low source/drain resistance. The ultra-short channel MOSFET with self-aligned silicide contact is required for a high-speed circuit. However, as mentioned in M. Ono, et al., in IEDM Tech. Dig., p119, 1993, it is difficult to define the gate length to be below 0.1 µm due to the limitation of current optical lithography.

SUMMARY OF THE INVENTION

This invention proposes a simple process to fabricate an ultra-short channel nMOSFET with self-aligned silicide contact for a high-speed device. The processes are described as follows. After growing a thin gate oxide film on a silicon substrate, an undoped poly-Si or amorphous Si (α-Si) film was deposited by a LPCVD system. Then, a thin nitride film and a n+ doped poly-Si film were deposited. The gate region was defined to etch back the n+ doped poly-Si film. A low temperature steam oxidation process was performed to oxidize the n+ doped poly-Si. At this time, the size of the n+ doped poly-Si film could be reduced to the range of nanometer dimension. The thermal polyoxide film was removed by a BOE or diluted HF solution and the residual doped poly-Si were used as a mask to etch the cap nitride film. The residual n+ doped poly-Si and the cap nitride film were used as a mask to etch undoped poly-Si to form an ultra-short channel gate. A CVD PSG film was deposited and then etched back to form PSG spacers. The cap nitride film was removed and a noble metal was deposited on all areas. The source, drain, and gate were doped by a high dose arsenic or phosphorous implant through the noble (or refractory) metal. Finally, the two-step RTP annealing process was used to form a self-aligned silicided (salicided) contact nMOSFET.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention will be described in detail with reference to the drawings. The purpose of the present invention is to provide a method for fabricating an ultra-short channel nMOSFET with self-aligned silicide contact for a high-speed device. The detailed processes will be described as follows.

Figure 1:
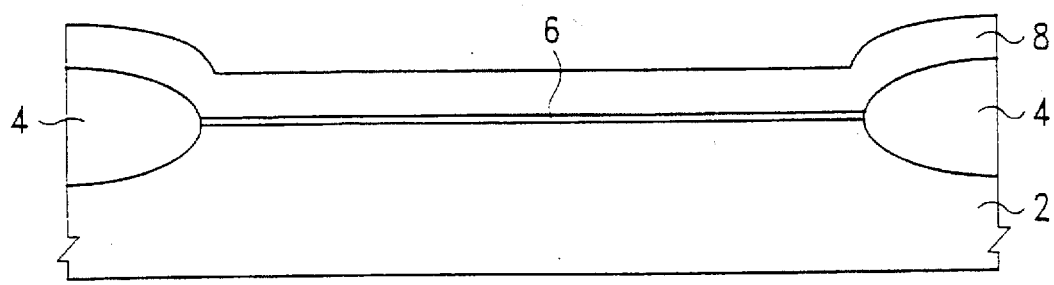
FIG. 1 is a cross-sectional view of a semiconductor substrate illustrating the step of growing a thin gate oxide layer and forming an undoped poly-Si layer on a semiconductor substrate according to the present invention.

With reference to FIG. 1, according to a preferred embodiment of the present invention, a single crystal silicon substrate 2 with a <100> crystallographic orientation is provided. A plurality of thick field oxide (FOX) regions 4 are formed to provide isolation between devices on the substrate. For example, the FOX regions 4 can be formed via lithography and etching steps to etch a silicon nitride-silicon dioxide composition layer. After the photoresist is removed and wet cleaned, thermal oxidation in an oxygen-steam environment is used to grow the FOX region 4 to a thickness of about 3000 to 8000 angstroms. The FOX region 4 can be replaced by a plurality of shallow trench isolations, as is well known in the art. Next, a silicon dioxide layer 6 is formed on the top surface of the substrate 2 to serve as a gate oxide layer. Typically, the silicon dioxide layer 6 is formed in oxygen ambient at a temperature of about 700° to 1100° Centigrade In this embodiment, the thickness of the silicon dioxide layer is approximately 15 to 250 angstroms. Alternatively, the oxide layer 6 may be formed using any suitable oxide chemical compositions and procedures.

An undoped polysilicon layer 8 is then deposited on the FOX regions 4 and the silicon dioxide layer 6 using a low-pressure chemical vapor deposition process. The undoped poly-Si layer 8 can be replaced by an amorphous-Si layer. In this embodiment, the thickness of the undoped polysilicon layer 8 is about 500 to 3000 angstroms. Next, standard lithography and etching steps are used to etch the silicon dioxide 4 and the polysilicon layer for forming a gate silicon structure consisting of the gate oxide 6 and the polysilicon 8.

Figure 2:
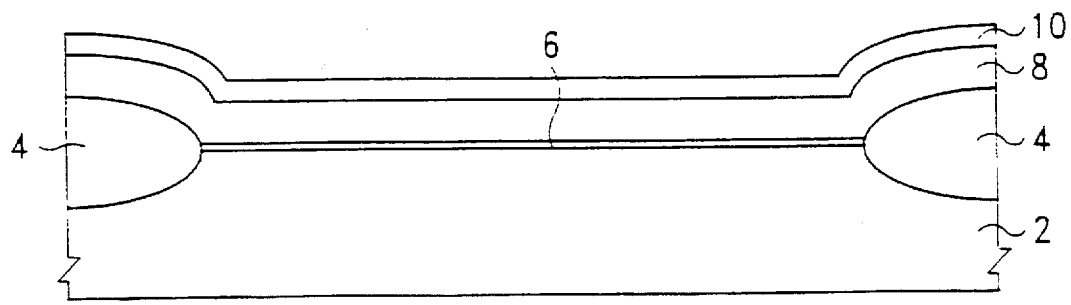
FIG. 2 is a cross-sectional view of a semiconductor substrate illustrating the step of forming a cap silicon nitride layer on the undoped poly-Si layer according to the present invention.

Referring to FIG. 2, a cap silicon nitride layer 10 is deposited on the undoped poly-Si layer 8. In this preferred embodiment, the thickness of the cap silicon nitride layer 10 is approximately 100 to 2000 angstroms.

Figure 3:
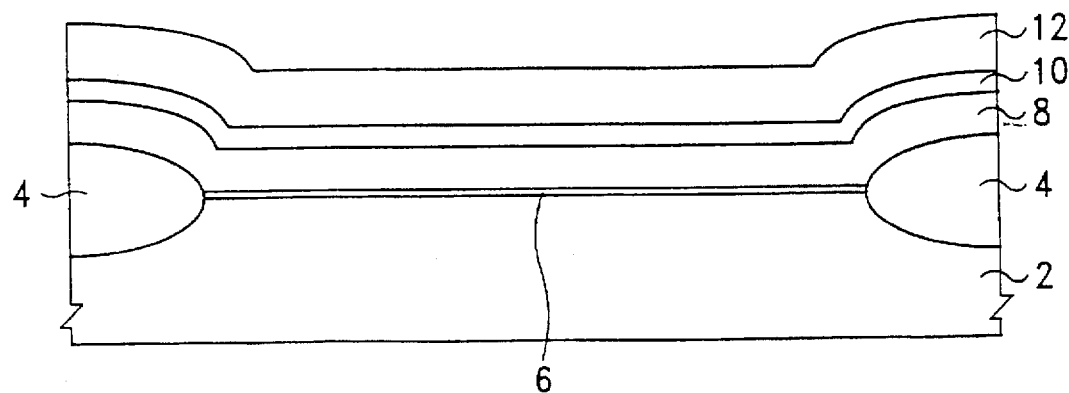
FIG. 3 is a cross-sectional view of a semiconductor substrate illustrating the step of forming n+ doped poly-Si on the cap silicon nitride layer according to the present invention.

Turning to FIG. 3, an n+ doped poly-Si layer 12 is deposited on the cap silicon nitride layer 10. In a preferred embodiment, the thickness of the n+ doped poly-Si layer 12 is approximately 500 to 3000 angstroms.

Figure 4:
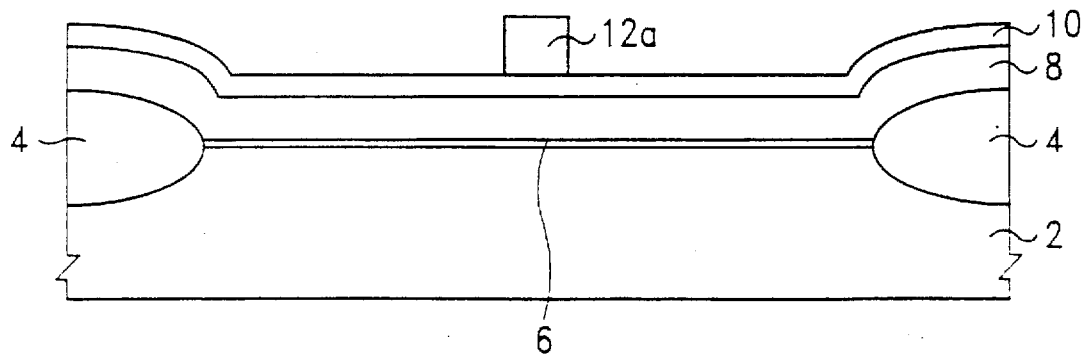
FIG. 4 is a cross-sectional view of a semiconductor substrate illustrating the step of defining a gate region according to the present invention.
Figure 5:
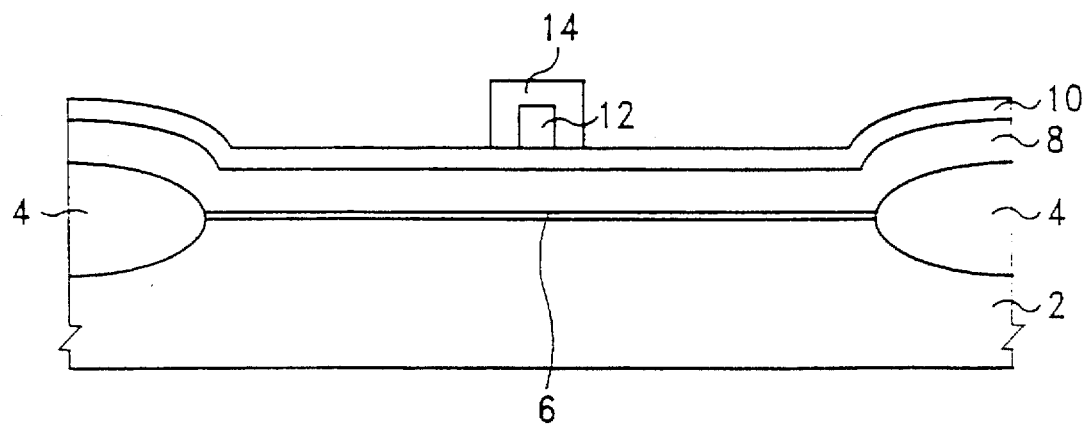
FIG. 5 is a cross-sectional view of a semiconductor substrate illustrating the step of performing a low temperature oxidation on n+ doped poly-Si layer according to the present invention.

Next, referring to FIG. 4, a gate region 12a is defined to etch back the n+ doped poly-Si layer 12 by using a photoresist layer as a mask. Turning to FIG. 5, a low temperature steam oxidation process is subsequently carried out to oxidize the residual n+ doped poly-Si layer 12. After this oxidation process is performed, a thermal polyoxide film 14 will grow on the surface of the residual n+ doped poly-Si layer 12. In a preferred embodiment, the low temperature steam oxidation is performed at a temperature range of about 700° to 900° Centigrade degrees for 5 to 60 minutes. Besides, the low temperature steam oxidation can be performed instead by a low temperature dry oxidation process. In this step, the size of the residual n+ doped poly-Si film 12 could be reduced to the range of nanometer dimensions.

Figure 6:
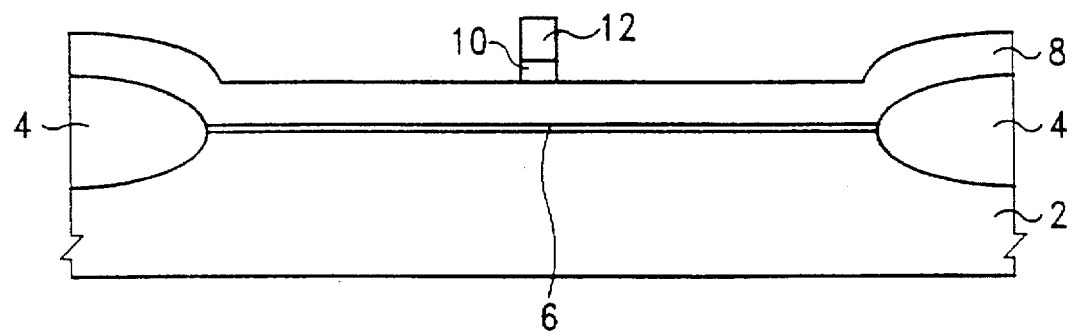
FIG. 6 is a cross-sectional view of a semiconductor substrate illustrating the step of removing the thermal oxide layer and then etching the cap silicon nitride layer according to the present invention.
Figure 7:
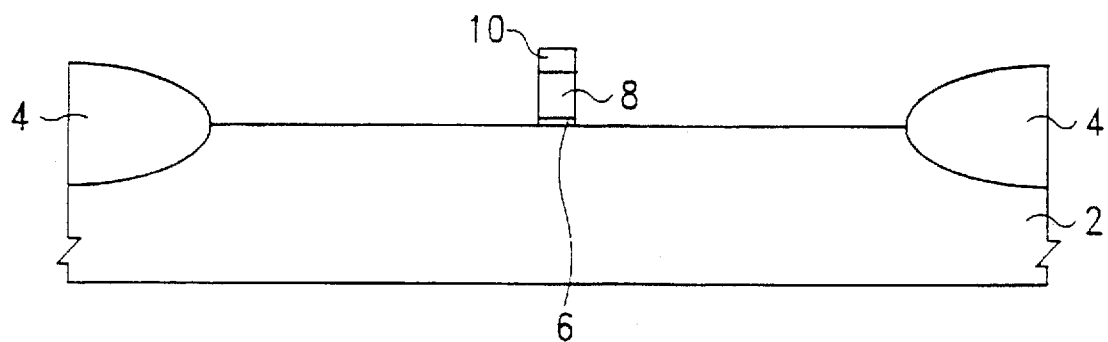
FIG. 7 is a cross-sectional view of a semiconductor substrate illustrating the step of etching the undoped poly-Si layer by using the residual n+ doped poly-Si as a hard mask according to the present invention.

Referring to FIG. 6, the thermal polyoxide film 14 is removed by a BOE or diluted HF solution and the residual doped poly-Si film 12 is used as a hard mask to etch the cap silicon nitride layer 10. In a preferred embodiment, the cap silicon nitride layer 10 is removed by a dry etching process. The plasma etchant can be chosen from the group consisting of $CF_4/O_2$, $CHF_3$, $C_2F_6$, $SF_6/He$. Subsequently, the residual doped poly-Si 12 and cap silicon nitride 10 is used as a mask to etch the undoped poly-Si layer 8 to form an ultra-short channel gate as shown in FIG. 7. The etchant can be chosen from the group consisting of $SiCl_4/Cl_2$, $BCl_3/Cl_2$, $Br_2/SF_6$.

Figure 8:
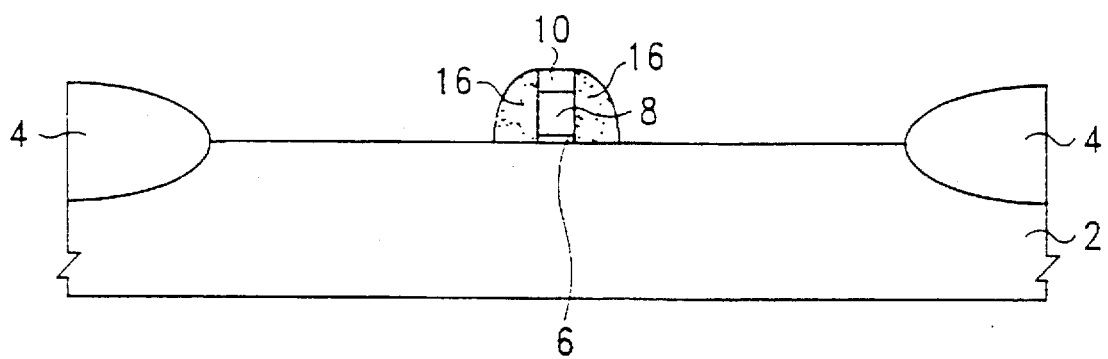
FIG. 8 is a cross-sectional view of a semiconductor substrate illustrating the step of forming a PSG oxide side-wall spacer according to the present invention.

Next referring to FIG. 8, a phosphosilicate glass (PSG) oxide film 16 is deposited over the FOX 4 (BSG oxide film for pMOSFET), the undoped poly-Si gate 8, and the substrate 2 by a chemical vapor deposition system. Next, an anisotropic etching is performed on the PSG oxide film 16 to form PSG oxide side-wall spacers 16 on the side walls of the gate 8. In this preferred embodiment, the PSG oxide layer 16 serves as a diffusion source to form the extended S/D junction for the minimum junction depth requirement.

Figure 9:
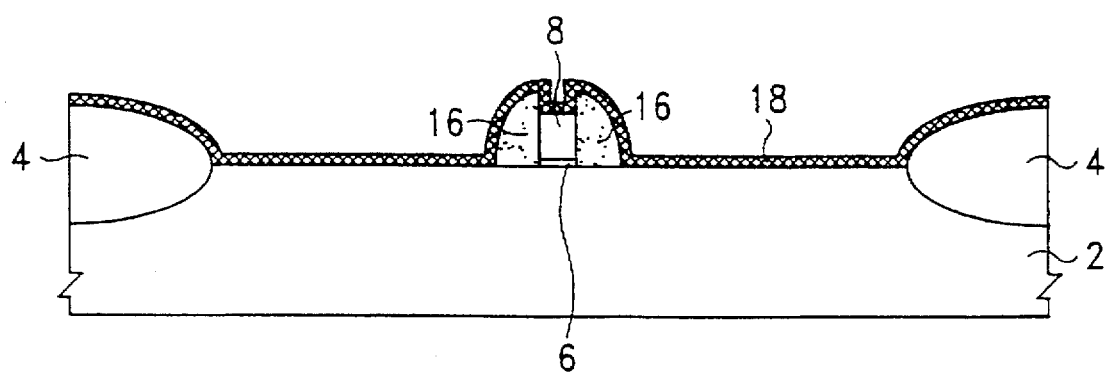
FIG. 9 is a cross-sectional view of a semiconductor substrate illustrating the step of removing the cap silicon nitride layer and then sputtering the noble or refractory metal on the gate and the substrate according to the present invention.

Turning to FIG. 9, the cap silicon nitride film 10 is removed by a hot $H_3PO_4$ solution. Following this step, a noble or refractory metal layer 18 is subsequently deposited over all areas. In this preferred embodiment, the noble metal can be chosen from the group consisting of Ti, W, Co, Pt, Ni, Cr, etc.

Figure 10:
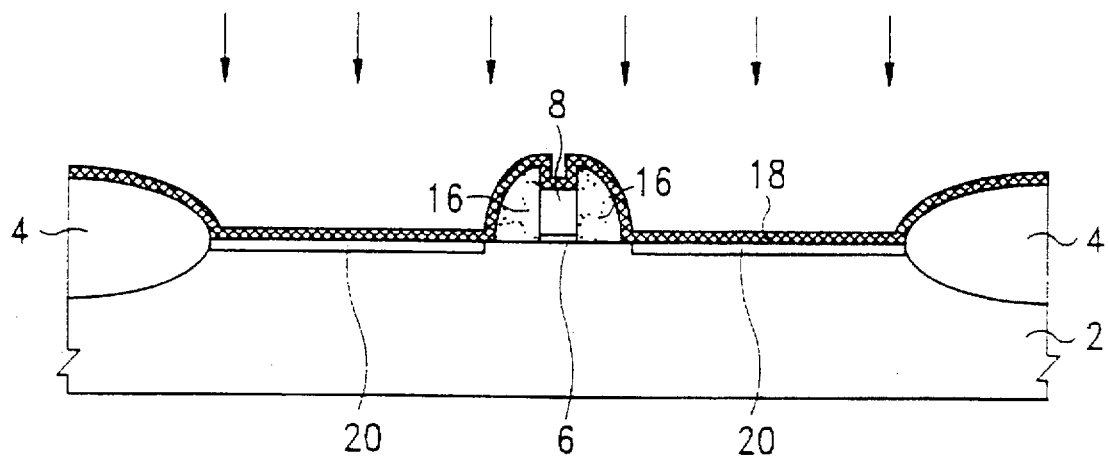
FIG. 10 is a cross-sectional view of a semiconductor substrate illustrating the step of performing an ion implantation to form the source and drain according to the present invention.

Referring to FIG. 10, a high dosage arsenic or phosphorus ion implantation is performed through the metal layer 18 to form source/drain regions 20 in the substrate 2 using the gate 8 and the PSG side-wall spacers 16 as a mask. In a preferred embodiment, the implantation energy is about 5 to 150 KeV and the dosage of the implantation is about $5\times10^{14}$ to $5\times10^{16}$ ions/cm$^2$.

Figure 11:
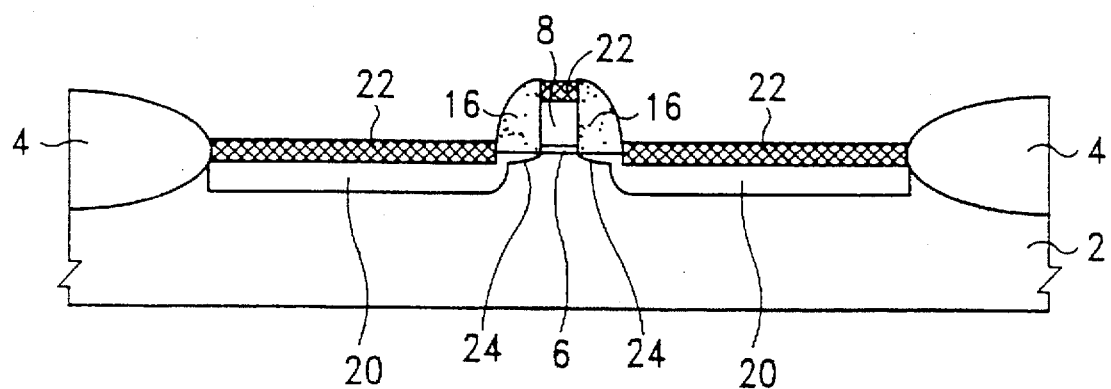
FIG. 11 is a cross-sectional view of a semiconductor substrate illustrating the step of performing a two-step RTP process to form SALICIDE and an extended S/D junction according to the present invention.

Referring to FIG. 11, in order to form a salicided contact 22 and an extended S/D junction 24, a two-step RTP process is carried out. The first rapid thermal process for annealing is performed to form metal silicide 22 on the top surface of the gate 8 and the surface of the source/drain regions 20 in the substrate 2. In this preferred embodiment, a first step RTP process is performed to form salicide 22 at a temperature of about 300° to 700° Centigrade for 30 to 180 seconds. The metal silicide layer 22 and any of the remaining metal layer 18 is etched, thereby leaving the metal silicide 22 on the top surface of gate 8 and in source and drain regions 20. Next, a second RTP process is performed to drive the impurities in PSG spacers to form an extended source and drain junction 24. In this preferred embodiment, the second rapid thermal process for annealing is performed at a temperature of about 700° to 1150° Centigrade for 10 to 100 seconds.

The benefits of this invention are (1) an ultra-short channel salicided contact nMOSFET could be obtained by using the current lithography technology; and (2) an extended ultra-shallow S/D junction could be formed by using PSG as the diffusion source to improve the short channel effect.

As is understood by a person skilled in the art, the foregoing preferred embodiments of the present invention are illustrative of the present invention rather than limiting of the present invention. It is intended to cover various modifications and similar arrangements included within the spirit and scope of the appended claims, the scope of which should be accorded the broadest interpretation so as to encompass all such modifications and similar structure.

While the preferred embodiment of the invention has been illustrated and described, it will be appreciated that various changes can be made therein without departing from the spirit and scope of the invention. For example, this method of the present invention for fabricating ultra-short channel nMOSFETs devices with a self-aligned silicided contact (nMOSFET PSG could be used for the extended S/D junction) also can be used in fabricating pMOSFETs (pMOSFET BSG could be used for the extended S/D junction) or CMOSFETs.

The embodiments of the invention in which an exclusive property or privilege is claimed are defined as follows:

1. A method for fabricating an ultra-short channel transistor in a semiconductor substrate with a self-aligned silicide contact, said method comprising the steps of:

forming a gate oxide layer on said substrate;

forming a first silicon layer over said gate oxide layer;

forming a first dielectric layer over said first silicon layer;

forming a second silicon layer over said first dielectric layer;

patterning said second silicon layer to define a gate region;

performing a thermal oxidation on said patterned second silicon gate region to oxidize the portion of said patterned second silicon layer into a thermal oxide film;

removing said thermal oxide film;

etching a portion of said first dielectric layer by using said residual second silicon layer as a mask;

etching said first silicon layer by using said residual second silicon layer and said residual first dielectric layer as a hard mask;

removing said residual second silicon layer;

forming a second dielectric layer over said residual first dielectric layer and said substrate to serve as an ion diffusion source;

etching said second dielectric layer to form side-wall spacers;

removing said residual first dielectric layer;

forming a metal layer on the surface of said side-wall spacers, said residual first silicon layer, and said substrate;

performing an ion implantation through said substrate to form first doped regions to serve as source and drain regions of said transistor;

performing a first rapid thermal annealing on said metal layer to form a metal silicide layer on the surface of said substrate and on the top surface of said residual first silicon layer; and performing a second rapid thermal annealing to form extended source and drain regions.

2. The method of claim 1, further including etching said metal silicide layer and any of the remaining metal layer thereby leaving said metal silicide on the top surface of said residual first silicon layer and in source and drain regions after performing a first rapid thermal annealing process.

3. The method of claim 1, wherein said first silicon layer is an undoped polysilicon layer.

4. The method of claim 3, wherein said undoped silicon layer have a thickness of about 500 to 3000 angstroms.

5. The method of claim 1, wherein said first dielectric layer is a silicon nitride layer.

6. The method of claim 4, wherein said silicon nitride layer have a thickness of about 100 to 2000 angstroms.

7. The method of claim 1, wherein said second silicon layer is undoped polysilicon layer.

8. The method of claim 7, wherein said doped silicon layer have a thickness of about 500 to 3000 angstroms.

9. The method of claim 1, wherein said second dielectric layer is a phosphosilicate glass (PSG) oxide layer.

10. The method of claim 9, wherein said PSG layer have a thickness of about 200 to 1500 angstroms.

11. The method of claim 1, wherein said thermal oxide layer being removed by a diluted HF solution.

12. The method of claim 1, wherein said thermal oxide layer being removed by BOE.

13. The method of claim 1, wherein said thermal oxidation is performed at a temperature of about 700° to 900° Centigrade for about 5~60 minutes.

14. The method of claim 1, wherein said ion implantation have implantation dosage about $5 \times 10^{14}$ to $5 \times 10^{16}$ ions/cm$^2$.

15. The method of claim 1, wherein said first rapid thermal annealing is performed at a temperature of about 300° to 700° Centigrade for about 30~180 seconds.

16. The method of claim 1, wherein said second rapid thermal annealing is performed at a temperature of about 700° to 1150° Centigrade for about 10~100 seconds.

17. A method for fabricating an ultra-short channel transistor in a semiconductor substrate with a self-aligned silicide contact, said method comprising the steps of:

forming a gate oxide layer on said substrate;

forming an doped polysilicon layer over said gate oxide layer;

forming a first dielectric layer over said first silicon layer;

forming undoped polysilicon layer over said first dielectric layer;

pattering said doped polysilicon layer to define a gate region;

performing a thermal oxidation on said patterned doped polysilicon gate region to oxidize a portion of said patterned doped polysilicon layer into a thermal oxide film;

removing said thermal oxide film;

etching a portion of said first dielectric layer by using said residual doped polysilicon layer as a mask;

etching said undoped polysilicon layer by using said residual doped polysilicon layer and said residual first dielectric layer as a mask;

removing said residual doped polysilicon layer;

forming a second dielectric layer over said residual first dielectric layer and said substrate to serve as an ion diffusion source;

etching said second dielectric layer to form side-wall spacers;

removing said residual first dielectric layer;

forming a metal layer on the surface of said side-wall spacers, said residual undoped polysilicon layer, and said substrate;

performing an ion implantation through said substrate to form first doped regions to serve as source and drain regions of said transistor;

performing a first rapid thermal annealing on said metal layer to form a metal silicide layer on the surface of said substrate and on the top surface of said residual first silicon layer; and performing a second rapid thermal annealing to form extended source and drain regions.

18. The method of claim 1, further including etching said metal silicide layer and any of the remaining metal layer thereby leaving said metal silicide on the top surface of said residual first silicon layer and in source and drain regions after performing a first rapid thermal annealing process.

19. The method of claim 17, wherein said first dielectric layer is a silicon nitride layer.

20. The method of claim 17, wherein said second dielectric layer is a phosphosilicate glass (PSG) oxide layer.

21. The method of claim 17, wherein said thermal oxide layer being removed by a diluted HF solution.

22. The method of claim 17, wherein said thermal oxide layer being removed by BOE.

23. The method of claim 17, wherein said thermal oxidation is performed at a temperature of about 700° to 900° Centigrade for about 5–60 minutes.

24. The method of claim 17, wherein said ion implantation have implantation dosage about $5 \times 10^{14}$ to $5 \times 10^{16}$ ions/cm$^2$.

25. The method of claim 17, wherein said first rapid thermal annealing is performed at a temperature of about 300° to 700° Centigrade for about 30~180 seconds.

26. The method of claim 17, wherein said second rapid thermal annealing is performed at a temperature of about 700° to 1150° Centigrade for about 10~100 seconds.

\* \* \* \* \*